RESISTIVE CONTROL FOR ELECTRONIC CIRCUITS

Filed Feb. 4, 1960 3 Sheets-Sheet 1

INVENTOR
WILLIAM EDWARD JOHNSTON
BY
Williamson, Schroeder & Palmatier
ATTORNEYS

Oct. 30, 1962 W. E. JOHNSTON 3,061,677

RESISTIVE CONTROL FOR ELECTRONIC CIRCUITS

Filed Feb. 4, 1960 3 Sheets-Sheet 2

INVENTOR
WILLIAM EDWARD JOHNSTON
BY
Williamson, Schroeder & Palmatier
ATTORNEYS

RESISTIVE CONTROL FOR ELECTRONIC CIRCUITS

Filed Feb. 4, 1960 3 Sheets-Sheet 3

INVENTOR
WILLIAM EDWARD JOHNSTON
BY
Williamson, Schroeder & Palmatier
ATTORNEYS 3,061,677
RESISTIVE CONTROL FOR ELECTRONIC CIRCUITS
William Edward Johnston, 708 W. 40th St., Minneapolis, Minn.
Filed Feb. 4, 1960, Ser. No. 6,699
20 Claims. (Cl. 179—1)

This invention relates to electronic circuit resistive controls particularly well adapted for use in transistor amplifiers and the like.

It will be understood that in many applications of transistor amplifiers, the amplifier circuit is tightly encased in a suitable housing along with sound transducers for converting audio power to electrical current and vice versa. Transistors now in commercial production vary quite widely in their amplifying characteristics, and as a result the overall gain of the amplifier cannot be accurately predicted and must be determined by tests after the amplifier circuitry is completed and is tightly encased in the housing. It appears from my experience that the actual encasement, as well as the actual nature of the circuit and the components therein, has some effect on the overall gain on the circuit and the propensity of the circuit to produce feed back. It has been common practice in transistor amplifier design, to control volume or gain of the amplifier circuit in the penultimate stage of amplification by connecting a potentiometer between the transistor emitter and the negative side of the power source and connecting the center tap of the potentiometer to the next stage through a condenser. The base resistor between the transistor base and the positive side of the power source has been fixed in most instances. This base resistor has been positioned within the housing in an inaccessible position and in order to adjust the overall gain of the amplifier so as to eliminate the feedback, it is necessary to first assemble the entire circuit and enclose it in the housing and if feedback is present, to change the size of the base resistor by trial and error until feedback is eliminated. To change this base resistor a number of times for adjusting the amplifier circuit amounts to considerable trouble and is quite time-consuming. The soldering and unsoldering of connections to the base electrode of the transistor also sometimes damages the transistor and requires replacement. In some instances in the past, the base resistor has taken the form of a variable fixed resistor such that it may be adjusted by opening up the casing, and once it has been adjusted it will be left in fixed position. The use of such a variable fixed resistor as the base resistor in the penultimate stage of the amplifier certainly has many disadvantages, and particularly disadvantage that this type of resistor occupies substantial space in the small housing and secondly, that the use of this resistor still requires the removal of the cover of the housing in order to adjust it and the results of the adjustment are not known until the cover is actually replaced and the transistor circuitry is again tightly encased.

It is the elimination of these and other disadvantages in the construction of electronic circuits and the like to which the present invention is directed, along with the inclusion in the invention of other novel and improved features.

An object of my invention is to provide a new and improved electronic circuit resistive control of simple and inexpensive construction and operation.

Another object of my invention is to provide a novel controllable resistance, well adapted to be used in any of a number of manners in an electronic circuit so as to facilitate ready and easy adjustment of the circuit.

A further object of my invention is to provide an improved and novel resistive control in an electronic circuit mounted in such a manner as to permit quick and easy changing of the resistance and to permit varying of the effective resistance in the circuit.

These and other objects and advantages of my invention will more fully appear from the following description made in connection with the accompanying drawings wherein like reference characters refer to the same or similar parts throughout the several views and in which.

Figures 1, 2, 3, 4, 5, 6, 7, 8A, 8B, 8C:
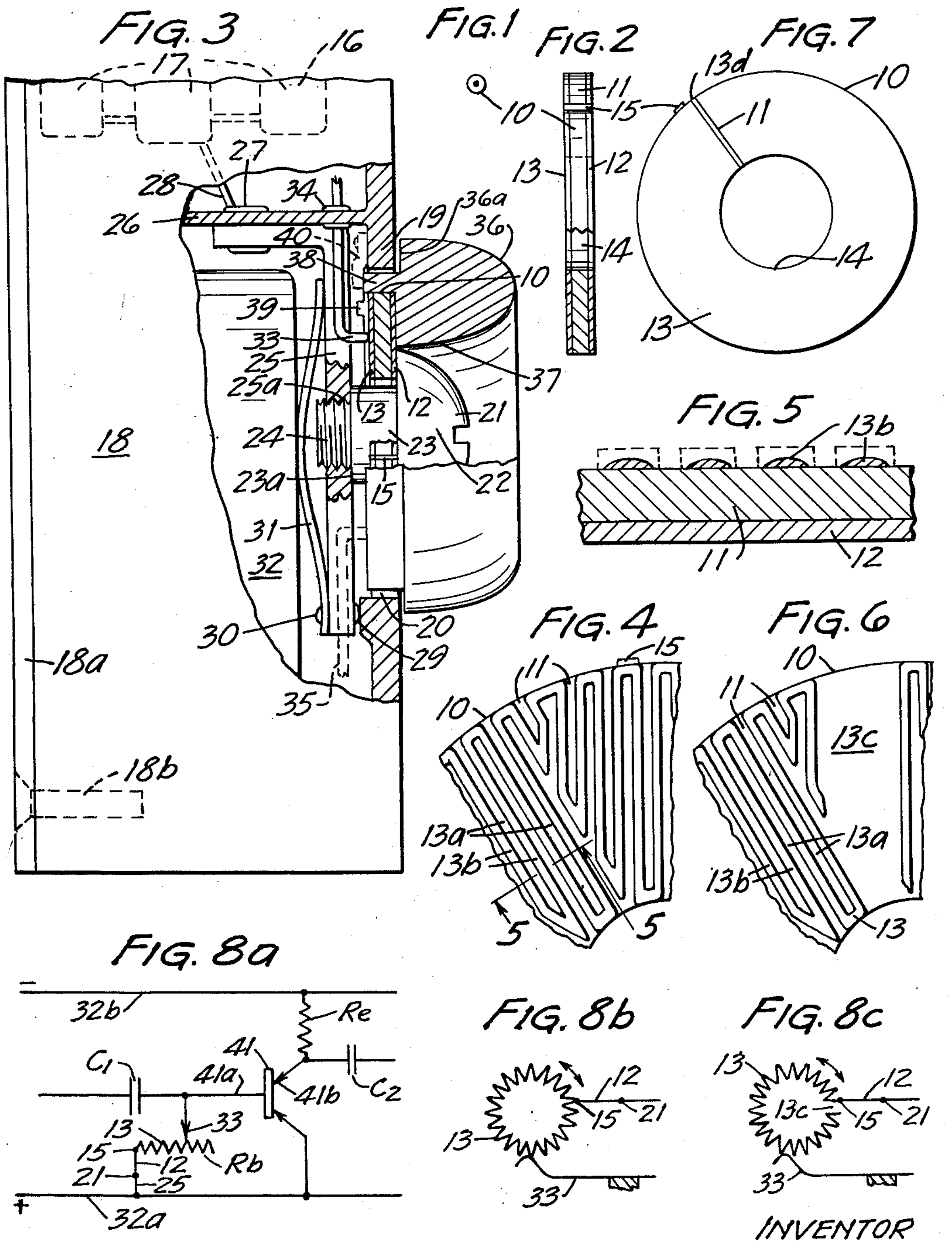
FIG. 1 is a front elevation of a resistive control element shown in its actual size as applied in one embodiment of the invention.
FIG. 2 is a side elevation, partly in section, of the control element of FIG. 1 and shown in a greatly enlarged scale for clarity of detail.
FIG. 3 is a detail elevation view of a housing encasing a transistor amplifier circuit and partly broken away and shown in section in order to show clarity of internal details, and shown on a scale approximating that of FIG. 2.
FIG. 4 is a detail front elevation of the element of FIG. 1 and in a scale approximating that of FIG. 2.
FIG. 5 is a detail section view taken at approximately 5—5 of FIG. 4.
FIG. 6 is a detail front elevation, similar to FIG. 4 but showing a slightly modified form of the resistive element.
FIG. 7 is a front elevation of another modified form of the resistive element.
Figure 9A:
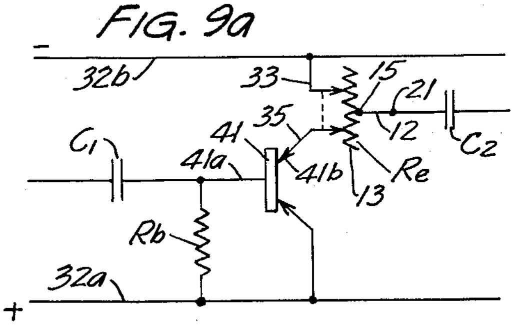
Figure 9B:
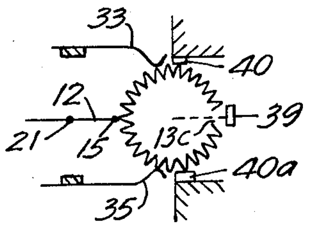
Figure 10A:
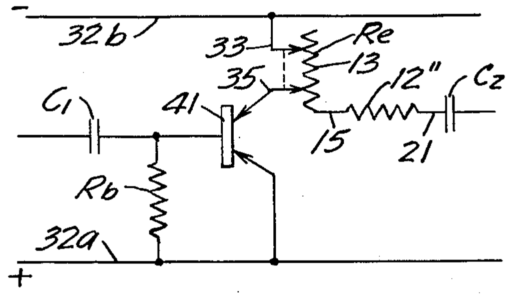
Figure 10B:
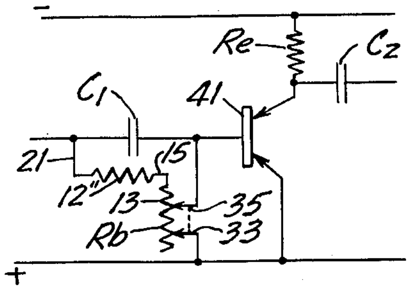
Figure 10C:
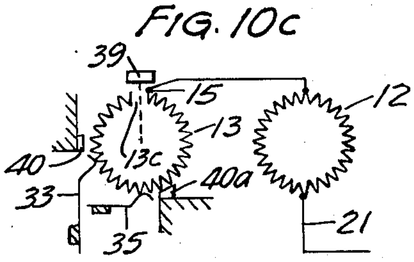
Figure 11:
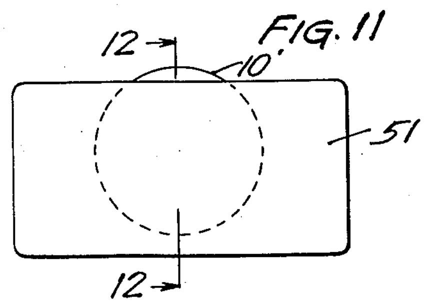
Figure 12:
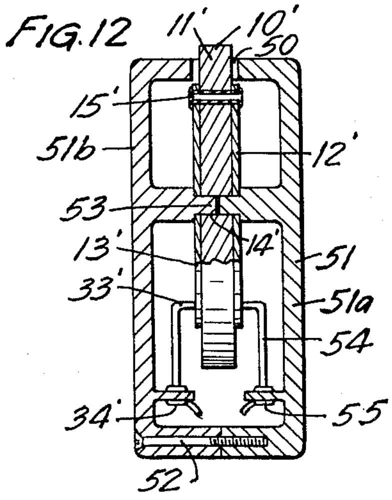
Figure 13:
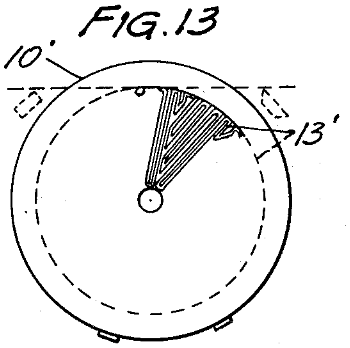
Figure 14:
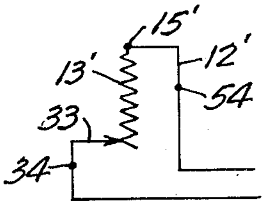
Figure 15:
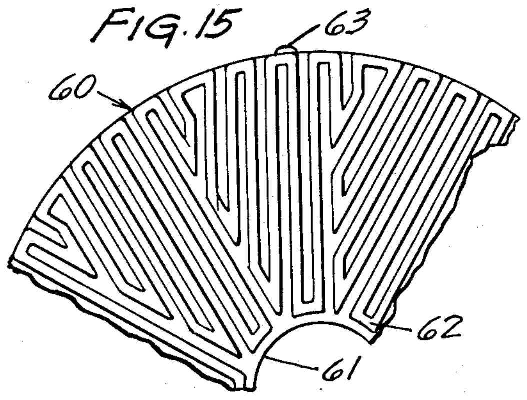
Figure 16:
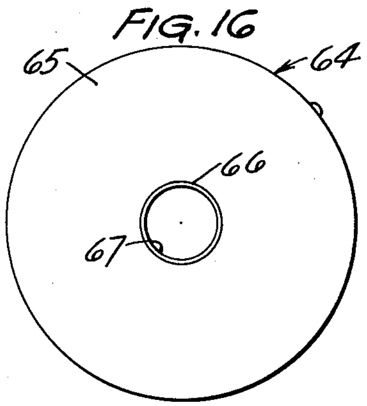
Figure 17:
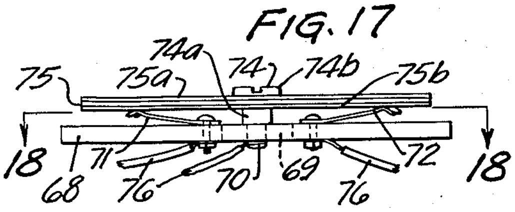
Figure 18:
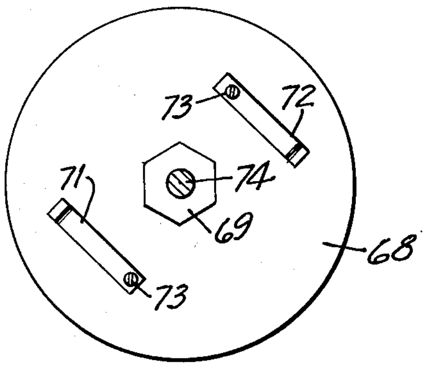
Figure 19:
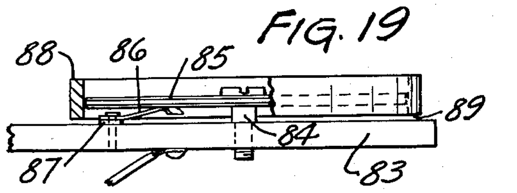
Figure 20:
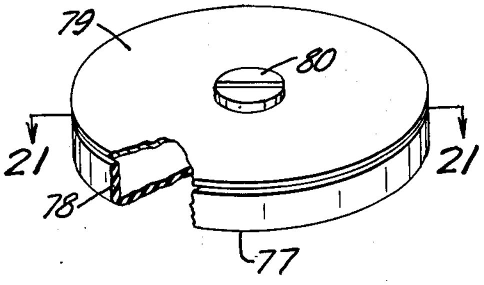
Figure 21:
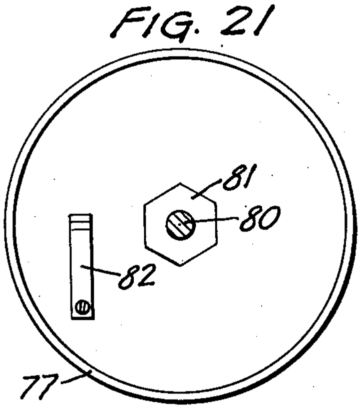

FIG. 8*a* is a schematic diagram of the penultimate stage of a transistor amplifier employing the resistive control as a variable resistor functioning as a volume control at the base resistor of the transistor;

FIGS. 8*b* and 8*c* are diagrammatic representations of the form of resistive control which may be used in the circuit of FIG. 8*a*;

FIG. 9*a* is another schematic circuit diagram of the penultimate stage in a transistor amplifier employing the resistive control as a potentiometer in the emitter circuit to control the amplification or volume;

FIG. 9*b* is a diagrammatic sketch showing the physical setup to embody the circuit of FIG. 9*a*;

FIGS. 10*a* and 10*b* are additional schematic circuit diagrams of the resistive control employed as a potentiometer in the penultimate transistor amplification stage and operating as a volume control;

FIG. 10*c* is a diagrammatic sketch of the physical relations embodied in the resistive control as employed in the circuits of FIGS. 10*a* and 10*b*;

FIG. 11 is a side elevation of a control unit employing the resistive control element of the present invention;

FIG. 12 is a detail section view taken along a broken line as indicated at 12—12 in FIG. 11;

FIG. 13 is an elevation view of the resistive control element employed in the device shown in FIG. 11;

FIG. 14 is a schematic circuit diagram of the apparatus shown in FIGS. 11 and 12;

FIG. 15 is a detailed front elevation view similar to FIG. 4 but showing a slightly modified construction of the disc;

FIG. 16 is a front elevation view of another slightly modified form of the disc;

FIG. 17 is an elevation view of a modified form of assembly;

FIG. 18 is a section view taken at 18—18 in FIG. 17;

FIG. 19 is a detail elevation view of another assembly which is shown partly in section for clarity of detail;

FIG. 20 is a perspective view of another modified form of the assembly, and being partly broken away for clarity of detail;

FIG. 21 is a detail section view taken approximately at 21—21 of FIG. 20.

The present invention employs a disc 10 which as used in one embodiment is shown approximately actual size in FIG. 1 and is shown in greatly enlarged scale in FIGS. 2–7. The disc 10 is of laminate construction and has a body lamina 11 of substantially rigid insulating material such as fiberglass sheet material which may be approximately 0.015 inch in thickness. The disc also includes a pair of conductive laminae 12 and 13 on opposite sides of the body lamina. In the embodiment shown, the lamina 12 is of highly conductive material such as copper, and the lamina 13 is constructed of high resistance material such as carbon or Nichrome, a material known in the art as containing approximately 80% nickel and 20% chromium, or on the alternative 60% nickel, 20% chromium and 20% iron. It has been found that to employ Nichrome high resistance material in the lamina 13 has certain advantages over the use of a carbon lamina but should be understood that the present invention is not confined to the use of Nichrome material. The annular disc 10 has an opening 14 through the middle thereof and a conductor 15 is provided for interconnecting a point on the outer periphery of the high resistance lamina 13 to the lamina 12. In the form of the disc 10 shown, the conductor 15 is a strip of highly conductive silver paint applied on the outer periphery of the disc and extending across the edge of the body lamina to the conductor laminae. FIG. 3 shows the resistive control assembled and applied to a transistor amplifier circuit 16, certain components 17 of which are shown in dotted lines and tightly encased in the casing or housing 18. The housing has a removable cover 18*a* secured by screws 18*b* so as to be removable to provide access into the interior chambers of the housing. The housing 18 has a panel portion 19 with an aperture or opening 20 therein, and it will be seen that the laminate disc 10 is disposed substantially in the plane of panel 19 in the aperture 20, and has the high resistance lamina 13 facing inwardly and the other highly conductive lamina 12 facing outwardly. The disc 10 is retained in the aperture 20 by means of a screw 21, the head 22 of which bears against the outer highly conductive lamina 12 of the disc, and the shank or post portion 23 extending through the central opening 14 of the disc 10 out of engagement with the lamina 13. The post or shank portion 23 of the screw has a reduced threaded inner end portion 24 which is threadably secured in a rigid conductor bar 25 which is suitably mounted in one of the chambers of the housing 18 and in the form shown, the conductor bar 25 is affixed to an interior support panel 26 of the housing by means of a conducting eyelet or grommet 27 which acts as a rivet and permits mounting of a conductor wire 28 thereto for connecting the lamina 12 of the disc into the transistor circuit 16. The post or shank portion 23 of the screw has a shoulder surface 23*a* which bears against the bar 25 around the tapped aperture 25*a*. In the form shown, the bar 25 extends across the aperture 20 and bears against the inner surface of the panel 19 at 29, at which point, a rivet 30 connects a spring terminal 31 to the bar 25, the spring terminal engaging the surface of a battery 32 which is contained in the compartment of the housing.

The high resistance lamina 13 of the disc bears against an outwardly projecting spring contact 33 which is also suitably affixed in the housing 18, and in the form shown is affixed to the panel portion 26 by a rigid grommet or eyelet 34, and the wire may extend through this grommet for connection into the transistor amplifier circuit 16. An additional contact 35 (shown in dotted lines) may be provided to engage the resistance lamina 13 at a position in circumferentially spaced relation from the contact 33, and the contact 35 will be affixedly mounted in the housing in a fashion similar to that described in connection with the contact. The contact 35 may or may not be used, depending upon the exact nature of the transistor circuitry to which the present invention is applied. The spring contact 35 also urges the disc against the screw head 22 and cooperates with the spring contact 33 in preventing tilting of the disc to maintain the lamina 12 flush against the screw head.

The disc 10 together with a manually operated knob 36, comprise the entire rotor of the resistive control. The several portions of the knob provide the means for rotating the disc, means maintaining the high resistance lamina 13 in insulating relation with the screw, and the means preventing tilting of the disc and thereby preventing the high resistive lamina from engaging the conductive bar 25 and thereby also maintaining a substantial surface area of lamina 12 in engagement with the screw head. To these ends, it will be seen that the knob 36 is disposed exteriorly of the housing 18 to rotate the disc and to center the disc so as to maintain the disc out of engagement with the post or shank portion 23 of the screw. The knob 36 is generally annular in shape, and the inner peripheral portion 37 engages the screw head 22 to maintain the knob and screw in coaxial relation. The knob 36 has inwardly projecting cylindrical lip 38, the inner cylindrical surface of which engages and frictionally holds the outer peripheral edge of the disc 10 so as to maintain the inner peripheral edge of the disc in spaced relation with the screw and thereby maintain lamina 13 in insulated relation with the screw 21. The lip portion 38 may have the stop or abutment 39 projecting inwardly therefrom and one or more stops or abutments 40 (shown in dotted lines in FIG. 3) may be provided if desired at the inner surfaces of the panel 19 to cooperate with the stop 39 in restricting rotation of the disc if it is desired, depending upon the nature of the circuit and the fashion in which the resistive control is employed, and hereinafter more fully set forth. The shoulder portion 36*a* confronts the panel portion 19 to prevent tilting of the disc, and the lip 38 will additionally, regardless of construction tolerances, always prevent lamina 13 from engaging bar 25.

It will be noted that by merely unscrewing the screw 21 from the bar 25, the disc 10 and the knob 36 may be lifted out without disturbing the physical relationships of any of the parts or components 17 of the amplifier circuitry 16 and the conductive bar 25 and contact 33 are exposed to the exterior when the disc is removed.

With regard to the preferred form of the high resistance lamina 13, the lamina 13 is shown in FIG. 4 with portions thereof etched out so as to expose the insulating body lamina in the etched out areas 13*a*. The etching is arranged so that the high resistance lamina takes the form of a long and continuous narrow strip 13*b* of high resistance material extending along a tortuous path, thereby greatly increasing the effective resistance of the lamina 13 between two spaced points thereon. In FIG. 4 the size of the strip 13*b*, as well as laminae-interconnecting strip 15, are exaggerated.

In FIG. 5 is shown the section through the disc 10 after the lamina 13 has been etched. When the etching has been completed, the strips 13*b* have the approximate shape of the dotted lines in FIG. 5, and it has been found that in this condition, a disc of the size shown in FIG. 1 wherein the strips 13*b* are approximately 0.003 inch wide and 0.001 inch thick, has a resistance around the entire surface of the disc of approximately 200 ohms. In this condition, the strip 13*b* is approximately six inches long on a disc of the size of FIG. 1. In order to increase the resistance of the lamina 13, it is subjected to an electropolishing process so as to reduce the thickness and width of the strips 13*b* into the rounded condition shown. By electropolishing the lamina 13, the total resistance around the base of the lamina may be increased to 500 ohms or 3000 ohms which have been found practical for use in connection with the transistor amplifier circuits, or the resistance, may if desired, be increased considerably above this level, into the neighborhood of one million ohms. In the form of the lamina shown in FIG. 4, the lamina is continuous around the entire face of the disc 10 so that as the disc is revolved through one-half revolution, the resistance between the conductive strip 15 and the contact 33 will vary from maximum to minimum.

In the form shown in FIG. 6, one entire radial portion in the area of numeral 13c is etched out so as to produce a radial break in the lamina 13. With the conductive strip 15 being disposed adjacent one side of the break, rotation of the disc through substantially a complete turn is necessary to cause the resistance between the strip 15 and the contact 33 to vary from maximum to minimum. It will be understood that for certain purposes, it is desirable that the break in the lamina 13 be disposed in circumferentially spaced relation from the conductive strip 15 as will be more clearly defined hereinafter.

In FIG. 7 the disc 10 is shown with the high resistance lamina 13 constructed of carbon and a radial break 13d is disposed adjacent the conducting strip 15 and allows the body lamina 11 to be exposed therethrough.

In FIG. 8a is shown a typical transistor amplifier stage including a transistor 41 having a base electrode 41a connected to a coupling condenser $C_1$ which carries the signal from the previous stage, and also connected to the base resistor $R_b$ which is actually the high resistance lamina 13 with the contact 33 being connected to the base electrode and the strip 15, lamina 12, screw 21 and bar 25 providing the connection to the positive side 32a of the power source or battery. The emitter electrode 41b is connected through a resistor $R_e$ to the negative side 32b of the power source and the emitter electrode is also connected to the coupling condenser $C_2$ which is connected to the next stage. Either of the arrangements of the present invention shown diagrammatically in FIGS. 8b and 8c may be employed in the circuit of FIG. 8a, the only difference being that if the arrangement of FIG. 8b is employed with the high resistance lamina being in a closed pattern, the base resistor $R_b$ may be varied from a minimum to a maximum over only a half a turn of the movement of the disc, and if the open arrangement with the break 13 being used, shown in FIG. 8c, a full turn of the disc is required for varying the base resistor resistance $R_b$ from its minimum to maximum.

In reference to FIG. 8a, the advantages of the present invention readily appear. Ordinarily the transistor amplifier stage shown in FIG. 8a will be the penultimate stage of the transistor amplifier wherein the output or gain of the amplifier is controlled to control the volume of sound produced by the sound-current transducer. It will be understood that the characteristics of mass produced transistors are not, at this time, confined within highly accurate tolerances and the nature of the transistors vary widely, and therefore, when the transistor circuit 16 is assembled and encased in the housing 18, the actual gain of the transistor amplifier cannot be accurately predicted. As a result, the actual gain must be determined by testing the assembled circuit. Frequently there will be substantial feedback from the sound output transducer into the sound input transducer and squealing of the circuit will result. It is therefore desired to reduce the overall gain of the amplifier to a point just below the level of amplification wherein feedback commences and to prevent the gain of the amplifier circuit to go above that predetermined level after the circuit is adjusted. It is, and has been, common practice to adjust the value of the base resistor $R_b$ of the penultimate stage of the amplifier in controlling the gain of the amplifier circuit. By using the present invention, the preferred amount of resistance at the base resistor $R_b$ is readily obtainable and this is accomplished as follows. After the entire amplifier circuit is assembled within the housing, the disc 10 and knob 36 is either removed or left off and the bar 25 and contact 33 are left exposed through the aperture 20. A calibrated variable resistor is then electrically connected by suitable leads to the bar 25 and contact 33 so as to determine the maximum resistance with which this particular amplifier circuit may have in its base resistor $R_b$ of the penultimate stage. When the maximum resistance is determined the disc 10 having a resistance lamina of the proper resistance is assembled with the knob 36 and is applied to the housing by turning the screw 21 into the threaded aperture 25a. The amplifier will then have the maximum permissible resistance in the base resistor $R_b$ of the penultimate stage and as the knob 36 and disc 10 is revolved, the effective resistance in the circuit at the base resistor $R_b$ is decreased from the maximum value to further reduce the overall gain of the circuit in order to adjust the volume of the output according to the desires of the use. It will be readily understood that this invention is readily applicable to hearing aids wherein the transistor amplifier circuit is confined in extremely close quarters in a housing of minimum size. The magnitude of the base resistor $R_b$ is easily determined and then the proper disc is applied which along with knob 36 functions as a volume control for the hearing aid. If the high resistnace lamina 13 has a break 13c therein, as shown in FIG. 8c, the gain of the amplifier circuit may be more carefully controlled by the user because he must turn a full turn of the knob 36 and disc 10 in order to vary the resistance and the amplification from minimum to maximum.

In the application of the present invention as shown in FIG. 9a, the transistor 41 has its base electrode 41a connected through the base resistor $R_b$ to the positive side of the power source and the base electrode is also connected to the input condenser $C_1$. The emitter electrode 41b is connected through the resistor $R_e$ to the negative side of the power source and is also connected through the resistor $R_b$ to the coupling condenser $C_2$. In FIG. 9a, the emitter resistor $R_e$ is embodied by the resistance lamina 13 connected through the contact 33 to the negative side of the power source and through contact 35 to the emitter electrode. The strip 15, lamina 12 and screw 21 connect the resistance to the condenser $C_2$. In the arrangement of the present application of the invention as shown in 9b, the contacts 33 and 35 maintain a constant resistance between the emitter electrode and the negative side of the source and the movement of the disc changes the amount of signal output which is applied to the coupling condenser $C_2$. It will be noted that in the present arrangement the strip 15 which interconnects the laminae of the disc is disposed at a position circumferentially spaced from the break 13c. In this form of the invention, the stop 39 which turns with the disc, and the stops 40 and 40a are arranged in relation to the resistance lamina and the contacts so as to prevent the break 13c in the resistance lamina from passing beneath either of the contacts.

It will be understood that the present invention may also employ a high resistance material in the lamina 12 of the disc 10 and in the FIGS. 10a, 10b and 10c are shown applications of this arrangement. The circuit arrangement of FIG. 10a is similar to FIG. 9a but in this circuit arrangement, the connecting strip 15 is disposed adjacent the end of the break 13c in the resistance lamina, and further, the resistance lamina 12″ is connected in series with the coupling condenser $C_2$. In the circuit arrangement shown in FIG. 10b, the disc 10 provides the base resistance $R_b$ and in addition provides a shunting resistor 12″ around the input condenser $C_1$. Again, as shown in FIG. 10c, the stops 39, 40 and 40a are arranged so as to prevent the break 13c in the resistance lamina 13 from passing beneath either of the contacts.

Although the circuit arrangements shown in FIGS. 9a, 10a and 10b require slight modification of the physical arrangement shown in FIG. 3, that is, to reconnect the contact 31 and bar 25 to other portions of the electrical circuit, these applications of the present invention are easily incorporated in the amplifier circuitry contained in the housing 18.

In FIGS. 11–14 is shown a slightly modified form of the invention which in the present instance embodies a volume control for a pillow speaker of the type used in hospitals and the like, to allow an individual patient to listen to the radio. The disc 10' has an insulating body lamina 11' of slightly larger diameter than the conductive laminae 12' and 13' which are interconnected by means of an eyelet 15' which extends through the body lamina 10' inwardly of its outer periphery for electrically interconnecting one point on the periphery of the high resistance lamina 13' with the other conductive lamina 12'. The edge portion of the insulating body lamina 11' may be manually engaged for rotating the disc, and the edge portion of the body lamina projects outwardly through a slot 50 in the two-part housing 51 which includes a pair of half shells 51*a* and 51*b* connected together by means of a screw 52 and the half shells providing endwise abutting axle portions 53 projecting through the central opening 14' of the disc. A contact 33' is suitably mounted in the housing by means of a grommet 34' and a second contact 54 is also mounted by a suitable grommet 55 in the housing. The disc 10' is shown at its face in FIG. 13, and the electrical arrangement of the construction is shown in FIG. 14. The grommets 34' and 54 may be suitably connected into a volume control circuit so as to connect the disc as a variable resistance.

This arrangement shown in FIGS. 11–14 also permits the ready and easy removal of the disc 10' to facilitate replacement thereof with resistance of the proper maximum magnitude. By merely removing the screw 15 the housing 51 will come apart to permit removal of the disc 10' and replacement thereof.

In FIG. 15, a slightly modified form of disc 60 is shown wherein the periphery of the mounting aperture 61 is spaced slightly inwardly from the innermost portions of etched high resistance lamina 62 which is otherwise identical to the lamina 13 shown in FIG. 4. The slight spacing between the aperture periphery and the lamina 62 positively insulates the lamina 62 from the screw in installation, so that the aperture periphery may engage the screw shank. Of course as in the other forms of the invention, a disc 60 is provided with the conductive strip 63 for interconnecting the high resistance lamina 62 with the other conductive lamina on the other side of the disc.

In FIG. 16, the disc 64 has the high resistance conductive lamina 65 on one surface thereof in which carbon is mixed with an epoxy resin. In this form of the invention the inner peripheral edge 66 of the high resistance lamina 65 is spaced from the periphery of the mounting aperture 67. The spacing between the aperture periphery and the inner periphery 66 is only slight, but is sufficient so as to provide insulation between the lamina 65 and the screw which may engage the aperture periphery. The slight spacing between the aperture periphery and the lamina inner periphery 66 is produced in the manufacturing operation of the disc wherein the aperture 67 is stamped out at the time the disc is being formed and after the lamina 65 has been applied. The epoxy resin of lamina 65 which carries the carbon is of a brittle nature and when the aperture 67 is stamped out, there will be sufficient splitting away of the lamina 65 adjacent the aperture as to produce the spacing shown.

The form of the invention shown in FIGS. 17 and 18 illustrates a simplified embodiment of the invention, wherein the supporting structure comprises a flat plate 68 which is constructed of insulating material such as fiberglass or Bakelite, and has a conductive member 69 which in the form shown, comprises a nut, embedded in the plate 68. The nut 69 has a threaded aperture 70 therein. A pair of spring contacts 71 and 72 are fixed to the insulating plate 68 by any suitable means such as rivets 73. A screw 74 is threaded into the aperture 70 of the nut 69. A disc 75 of a type hereinbefore described, is mounted on the shank portion 74*a* of screw 74 and is retained by the screw head 74*b* which lies flush against the highly conductive lamina 75*a* of the disc, and the other highly resistive lamina 75*b* engages the spring contacts 71 and 72. The spring contacts 71 and 72, and the nut 69 are connected as by conventional soldering or the like to circuit connections 76.

It should be noted that the disc 75 is readily removable by merely removing the screw 74, and that the area above the disc 75 is open and unobstructed so as to facilitate ready and easy application of a replacement disc.

The form of the invention shown in FIGS. 17 and 18 is readily applicable to installations wherein a resistive control must be easily adjustable to any of a number of ranges of resistance and must be adjustable to a high degree so as to obtain the precise resistance necessary in the circuit. The disc 75 having a proper resistance in the lamina 75*b* is applied and then is rotated on the screw until the proper adjustment is obtained. One or both of the contacts 71 and 72 may be connected into the circuit, but the provision of both spring contacts in symmetrical arrangement around the screw prevents tilting of the disc and thereby maintains the lamina 75*a* flush against the screw head.

The form of the invention shown in FIG. 20 is similar to that of FIGS. 17 and 18 except that the supporting structure comprises a cup-like receptacle 77 having an upstanding peripheral wall 78, the upper edge of which is in closely spaced, and confronting relation with the disc 79 which is retained by the screw 80 which is threaded into the nut 81 embedded in the bottom of the receptacle. The spring contact 82 bears against the bottom high resistance lamina of the disc. The spring contact 82 and nut 81 are connectible into a circuit. It will be seen that the peripheral wall 78 of the receptacle-like supporting structure 77 prevents tilting of the disc 79 and maintains the top lamina of the disc flush against the screw head.

The form of the invention shown in FIG. 19 has a conductive metal bar 83 comprising the supporting structure into which the screw 84 is threaded. The disc 85 is mounted on and retained by the screw 84, and the spring contact 86 is mounted on the bar 83 and may be insulated therefrom as by an insulating strip 87. In this form of the invention, a sleeve-like ring of insulating material 88 is mounted on the periphery of the disc and is positioned so that the lower peripheral surface 89 of the ring 88 is in closely spaced and confronting relation with the bar 83 so as to prevent tilting of the disc and thereby maintain the disc flush against the screw head.

The forms of the invention shown in FIGS. 19, 20 and 21 are applicable in situations similar to the form shown in FIGS. 17 and 18. In FIG. 19 the ring 88 serves the additional function of providing a handling medium for the disc so that it may be manually rotated without touching any of the conductive laminae. It will be understood that the discs 75, 85 and 79, all maintain the high resistance laminae in spaced and insulating relation with the shank of the screw in the fashion set forth in FIGS. 15 and 16.

It will, of course, be understood that various changes may be made in the form, detail, arrangement and proportion of the parts without departing from the scope of my invention, which consists of the matter described herein and set forth in the appended claims.

What is claimed is:

1. An electronic circuit resistive control comprising a supporting structure, a laminate disc having an insulating body lamina with a pair of conductive laminae on opposite sides thereof, one of said conductive laminae being constructed of high resistance material, conductive means connecting a point on the outer periphery of said high resistance lamina with the other conductive lamina, a spring contact on the supporting structure and slidably engaging said high resistance lamina, a mechanism on the supporting structure slidably engaging said other conductive lamina in electrically conductive relation and mounting said disc for rotation about an axis spaced from said contact, and means on the disc for revolving the same.

2. An electronic circuit resistive control comprising a supporting structure, a laminate disc having an insulating body lamina with a pair of conductive laminae on opposite sides thereof, one of said conductive laminae being constructed of high resistance material, conductive means connecting a point on the outer periphery of said high resistance lamina with the other conductive lamina, a spring contact on the supporting structure and slidably engaging said high resistance lamina, and mechanism slidably engaging said other conductive lamina in electrically conductive relation, said mechanism having means detachably secured to the supporting structure and mounting said disc for rotation about an axis spaced from said contact, and means on the disc for revolving the same, whereby to permit confinement of the control in an area of small compass.

3. The invention set forth in claim 1 and said conductive means comprising a conductive strip across the outer periphery edge of a disc and interconnecting said pair of conductive laminae.

4. The invention set forth in claim 1 and said conductive means comprising a conductor extending through the disc interconnecting the outer peripheral portions of said pair of conductive laminae.

5. An electronic circuit resistive control comprising a supporting structure including a panel having an aperture therein and also having front and rear sides, a laminate disc having an insulating body lamina with a pair of conductive laminae on opposite sides thereof, one of said conductive laminae being constructed of high resistance material, conductive means connecting a point on the outer periphey of the high resistance lamina with the other conductive lamina, a spring contact mounted on the supporting structure and having a disc-engaging portion adjacent the rear side of the panel at the aperture, releasable means on the supporting structure rotatably mounting the disc with the high resistance lamina in continuous sliding engagement with the disc-engaging portion of the contact and said releasable means including a rigid conductive medium engaging said other conductive lamina and retaaining said disc against the contact, means preventing said conductive medium from engaging said high resistance lamina and providing an insualting handle at the front side of the panel for turning the disc, whereby to permit replacement of the disc from the front side of the panel without disturbing any of the electronic circuit which may be disposed adjacent the rear side of the panel connected with said contact and said conductive medium.

6. The invention set forth in claim 5 and said high resistance lamina having a radially extending break therein.

7. The invention set forth in claim 6 and said break being disposed adjacnt the point at which said conductive mass interconnects said conductive laminae.

8. The invention set forth in claim 6 and a second spring contact mounted on the supporting structure and having a portion continuously engaging the high space resistance lamina of the disc in circumferentially spaced relation with the first-mentioned contact.

9. The invention set forth in claim 8 and said break being disposed in circumferentially spaced relation with the point at which said conductive means interconnects said pair of conductive laminae, and stop means connected with the disc and with the supporting structure and cooperatively arranged with respect to the break in the high resistance lamina and the contacts to prevent said break from passing under either of the contacts as the disc is rotated.

10. The invention set forth in claim 8 and said break being disposed adjacent the point at which said conductive means interconnects said pair of laminae, and stop means connected with the disc and with the supporting structure and cooperatively oriented with respect to the break in the high resistance lamina and the contacts to prevent said break from passing under either of the contacts as the disc is rotated.

11. An electronic circuit resistive control, comprising a supporting structure including a panel having an aperture therein and having front and rear sides, a laminate annular disc having an insulating body lamina with a pair of conductive laminae on opposite sides thereof, one of said conductive laminae being constructed of high resistance material, conductive means connecting a point on the outer periphery of the high resistance lamina with the other conductive lamina, a spring contact mounted on the supporting structure and having a disc-engaging portion adjacent the rear side of the panel at the aperture, releasable conductor and mounting means on the supporting structure and including a post projecting through the center of the annular disc and in spaced relation therewith and also including a retaining head on the post slidably engaging said other conductive lamina, and holding the disc against the contact and rigid insulating means bearing against the outer periphery of the disc and said head and preventing movement of the disc against the post.

12. The invention set forth in claim 11 wherein said rigid insulating means projects outwardly from the front side of the panel to be manually gripped for turning the disc.

13. An electronic circuit resistive control comprising a support structure including a panel having an aperture therein and having front and rear sides, a laminate annular disc having an insulating body lamina with a pair of conductive laminae on opposite sides thereof, one of said conductive laminae being constructed of high resistance material, conductive means connecting a point on the outer periphery of the high resistance lamina with the other conductive lamina, a spring contact mounted on the supporting structure and having a disc-engaging portion adjacent the rear side of the panel at the aperture, said disc being disposed in the aperture and lying substantially in the plane of the panel, releasable conductor and mounting means on the supporting structure and including a post projecting through the center of the annular disc and in spaced relation therewith and also including a retaining head on the post slidably engaging said other conductive lamina and holding the disc against the contact, the rigid insulating means bearing against the outer periphery of the disc and said head and preventing movement of the disc against the post.

14. In combination, a housing with a cover, a transistor amplifier circuit including sound-current transducer means encased in the housing, the amplifier circuit including a transisitor amplifier stage with a variable base resistor comprising a laminate annular disc having an insulating body lamina with a pair of conductive laminae on opposite sides thereof, one of said conductive laminae being constructed of a high resistance material, conductive means connecting a point on the outer periphery of a high resistance lamina with the other conductive lamina, said housing having an aperture therein, a spring contact mounted in the housing and having a disc-engaging portion projecting outwardly toward the aperture, releasable conductor and mounting means on the housing and including a post projecting through the center of said annular disc and in spaced relation therewith and also including a retaining head on the post positioning the disc in the aperture and slidably engaging said other conductive lamina, and rigid insulating means at the exterior of the housing bearing against the outer periphery of the disc and said head and preventing movement of the disc against the post, and means connecting said contact and said releasable conductor and mounting means into said transistor amplifier stage.

15. The invention set forth in claim 14 wherein said housing comprises a pair of hollow shell halves, and said releasable conductor and mounting means on the housing including a two-part post, one of said parts being affixed to one of the shell halves and the other part of the post being affixed to the other shell half, said spring contact being mounted on one of said shell halves, and a second spring contact on the shell half, and releasable means securing the shell halves together.

16. An electronic circuit resistive control comprising an insulating supporting structure, including a rigid conductive member thereon for connection to the circuit, said conductive member having a threaded hole therein, a conductive screw threaded in said hole and having a head, a laminate disc having a mounting aperture receiving the screw therethrough, said laminate disc including an insulating body lamina and also including first and second conductive laminae respectively disposed on opposite sides of the body lamina, said first conductive lamina engaging said screw head in conducting relation, said second conductive lamina being insulated from the screw and being constructed of high resistance material, conductive means extending across a point on an edge of the disc at a location spaced radially outwardly from said aperture and interconnecting said conductive laminae, and a spring contact on the supporting structure for connection to the circuit, said contact bearing against said second conductive lamina and urging said disc toward the screw head.

17. An electronic circuit resistive control comprising an insulating supporting structure including a rigid conductive member thereon for connection to the circuit, said conductive member having a threaded hole therein, a conductive screw threaded in said hole and having a head, a laminate disc having a mounting aperture receiving the screw therethrough, said laminate disc including an insulating body lamina and also including first and second conductive laminae respectively disposed on opposite sides of the body lamina, said first conductive lamina engaging said screw head in conducting relation, means restricting wobbling of the disc on the screw whereby to maintain said first lamina flush against the screw head, said second conductive lamina being insulated from the screw and being constructed of high resistance material, conductive means extending across a point on an edge of the disc at a location spaced radially outwardly from said aperture and interconnecting said conductive laminae, and a spring contact on the supporting structure for connection to the circuit, said contact bearing against said second conductive lamina and urging said disc toward the screw head.

18. An electronic circuit resistive control comprising an insulating supporting structure including a rigid conductive member thereon for connection to the circuit, said conductive member having a threaded hole therein, a conductive screw threaded in said hole and having a head, a laminate disc having a mounting aperture receiving the screw therethrough, said laminate disc including an insulating body lamina and also including first and second conductive laminae respectively disposed on opposite sides of the body lamina, said first conductive lamina engaging said screw head in conducting relation, said second conductive lamina being insulated from the screw and being constructed of high resistance material, conductive means extending across a point on an edge of the disc at a location spaced radially outwardly from said aperture and interconnecting said conductive laminae, and a plurality of spaced spring contacts on the supporting structure for connection to the circuit, said spring contacts being arranged about the screw and bearing against said second conductive lamina of the disc to urge the disc toward the screw head and prevent wobbling of the disc on the screw whereby to maintain the first conductive lamina flush against the screw head.

19. The invention set forth in claim 16 and said supporting structure being substantially cup-shaped and having a peripheral sidewall with an upper edge in closely spaced and confronting relation with the second lamina of the disc and restricting wobbling of the disc to maintain the first conductive lamina flush against the screw head.

20. The invention set forth in claim 16 and said supporting structure having a substantially planar configuration parallel to the disc, and a sleeve on the periphery of the disc and having one edge in closely spaced, confronting relation with the supporting structure and restricting wobbling of the disc to maintain the first conductive lamina flush against the screw head.

References Cited in the file of this patent

UNITED STATES PATENTS

| | | |
|---|---|---|
| Re. 19,605 | Flanzer | June 11, 1935 |
| 1,587,136 | Appleby | June 1, 1926 |
| 1,767,715 | Stoekle | June 24, 1930 |
| 2,321,587 | Davis et al. | June 15, 1943 |
| 2,842,623 | Lehr | July 8, 1958 |
| 2,870,255 | Jenkins et al. | Jan. 20, 1959 |

UNITED STATES PATENT OFFICE

CERTIFICATE OF CORRECTION

Patent No. 3,061,677 October 30, 196

William Edward Johnston

It is hereby certified that error appears in the above numbered patent requiring correction and that the said Letters Patent should read as corrected below.

Column 9, line 46, for "retaaining" read -- retaining --; line 60, for "mass" read -- means --; line 63, strike out "space"; column 10, line 33, for "support" read -- supporting --.

Signed and sealed this 23rd day of April 1963.

(SEAL)
Attest:

ERNEST W. SWIDER
Attesting Officer

DAVID L. LADD
Commissioner of Patents